(12) United States Patent
Kuo

(10) Patent No.: US 6,940,719 B1
(45) Date of Patent: Sep. 6, 2005

(54) FAN DEVICE

(75) Inventor: Wei-Chen Kuo, Kaohsiung (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 0 days.

(21) Appl. No.: 10/792,701

(22) Filed: Mar. 5, 2004

(30) Foreign Application Priority Data

Apr. 16, 2003 (CN) .................................. 92205969

(51) Int. Cl.$^7$ .............................................. H05K 7/20
(52) U.S. Cl. .................................... 361/697; 165/80.3
(58) Field of Search ...................... 361/697; 454/184; 165/80.3; 416/228, 223 R

(56) References Cited

U.S. PATENT DOCUMENTS

| | | | |
|---|---|---|---|
| 2,650,752 A | * | 9/1953 | Hoadley ...................... 415/194 |
| 5,794,685 A | * | 8/1998 | Dean .......................... 165/121 |
| 6,196,300 B1 | * | 3/2001 | Checchetti .................. 165/80.3 |
| 6,578,625 B1 | * | 6/2003 | Wyatt et al. ................ 165/80.3 |
| 6,584,799 B2 | * | 7/2003 | Jung et al. ..................... 62/419 |
| 6,637,502 B1 | * | 10/2003 | North et al. ................ 165/80.3 |
| 6,779,563 B2 | * | 8/2004 | Schwert et al. ................ 138/98 |
| 6,779,593 B1 | * | 8/2004 | Hegde ........................ 165/80.3 |
| 2002/0079086 A1 | * | 6/2002 | Huang et al. .............. 165/80.3 |
| 2003/0188849 A1 | * | 10/2003 | Gawve ........................ 165/80.3 |

* cited by examiner

*Primary Examiner*—Harold Joyce

(57) ABSTRACT

A fan device a frame includes a frame and a fan blade part. The fan blade part is composed of a fan hub and fan blades. The frame is provided with a driving part being rotationally attached to the fan blade part. The driving part is fixed to the frame with locating parts such that a difference of distance is formed between a facial side of the frame and the joining surface of the driving part. The fan hub is shorter than the fan blade part in height so that air current generated by the fan blades can flow fast without being stagnated under the joining surface of the driving part.

1 Claim, 4 Drawing Sheets

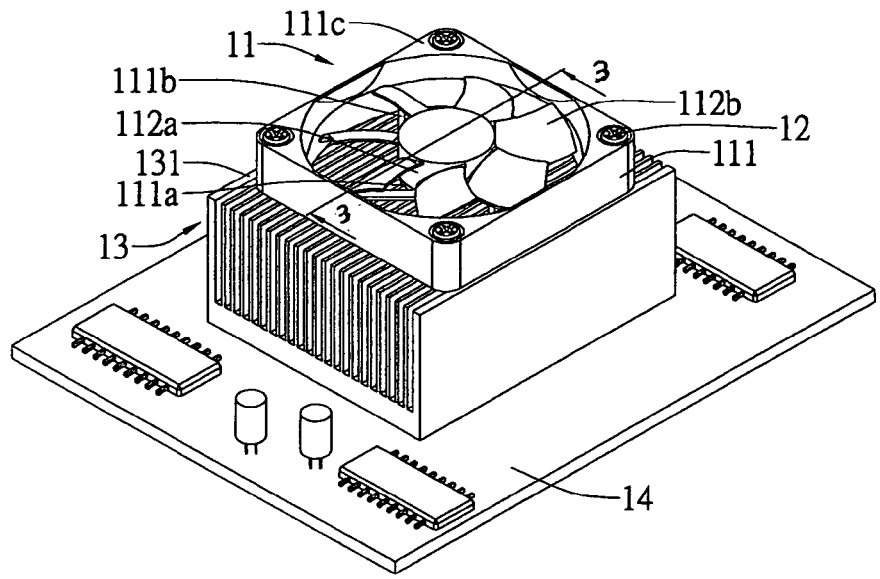
FIG 2    (PRIOR ART)
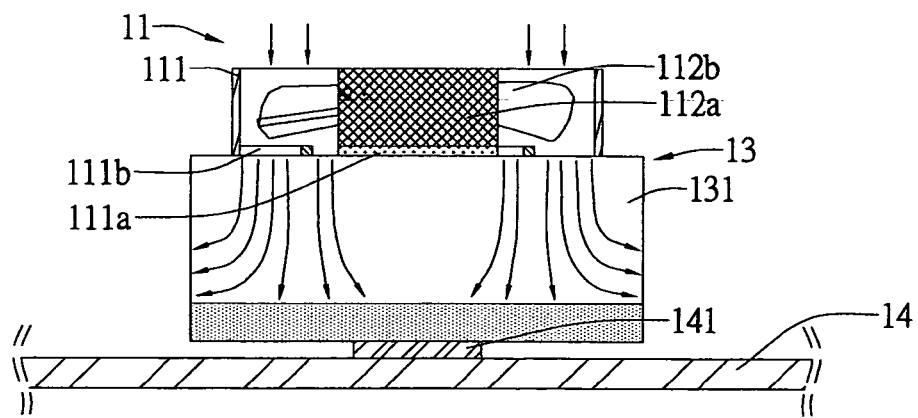
FIG 3    (PRIOR ART)

FAN DEVICE

BACKGROUND OF THE INVENTION

1. Field of the Invention

The present invention is related to a fan device, particularly to a fan device mounted on the cooling fins.

2. Brief Description of Related Art

Generally, a conventional fan as shown in FIG. 1 is basically composed of a frame 111 and a fan blade part 112. The fan blade part 112 is further composed of a fan hub 112a and fan blades surrounding the fan hub 112a. The frame 111 has a driving part 111a, which rotationally joins with the fan hub 112a, fixedly attached to the center of the frame 111 by means of locating posts 111b in a way of the engaging surface 111d of the driving part 111a being flush with a facial side 111c of the frame 111.

Referring to FIG. 2 in company with FIG. 1, during being assembled, the fan device is engaged to the radiator 13 by way of the screw thread components 12 passing through holes 111e of the frame and fastening to the cooling fins 131. Then, the fan, which is associated with the radiator, is mounted on the chip 141, which is attached to the circuit board 14.

Referring to FIG. 3, once the fan blade part 112 is actuated to rotate by the driving part 111a, it occurs a phenomenon that air current under the engaging surface 111d of the driving part 111a produces a large stagnation zone and it results in undesirable cooling effect.

SUMMARY OF THE INVENTION

An object of the present invention is to provide a fan device, which is capable of enhancing the cooling effect substantially.

BRIEF DESCRIPTION OF THE DRAWINGS

The detail structure, the applied principle, the function and the effectiveness of the present invention can be more fully understood with reference to the following description and accompanying drawings, in which:

FIG. 2 is an assembled perspective view of FIG. 1;

FIG. 3 is a sectional view along line 3—3 shown in FIG. 2 illustrating flowing direction of air current;

DETAILED DESCRIPTION OF THE PREFERRED EMBODIMENT

Figure 1:
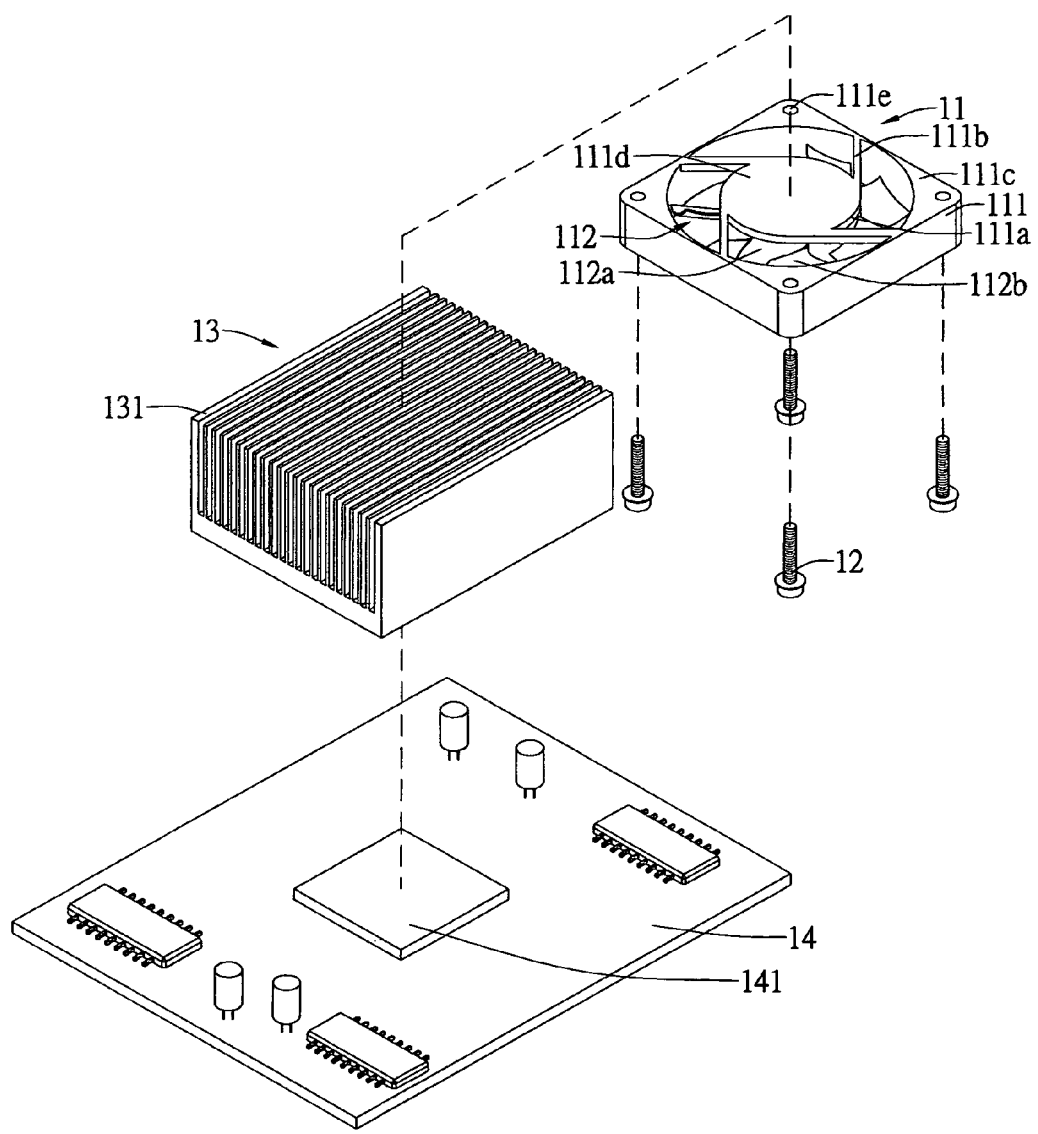
FIG. 1 is an exploded perspective view of the conventional fan device.
Figure 4:
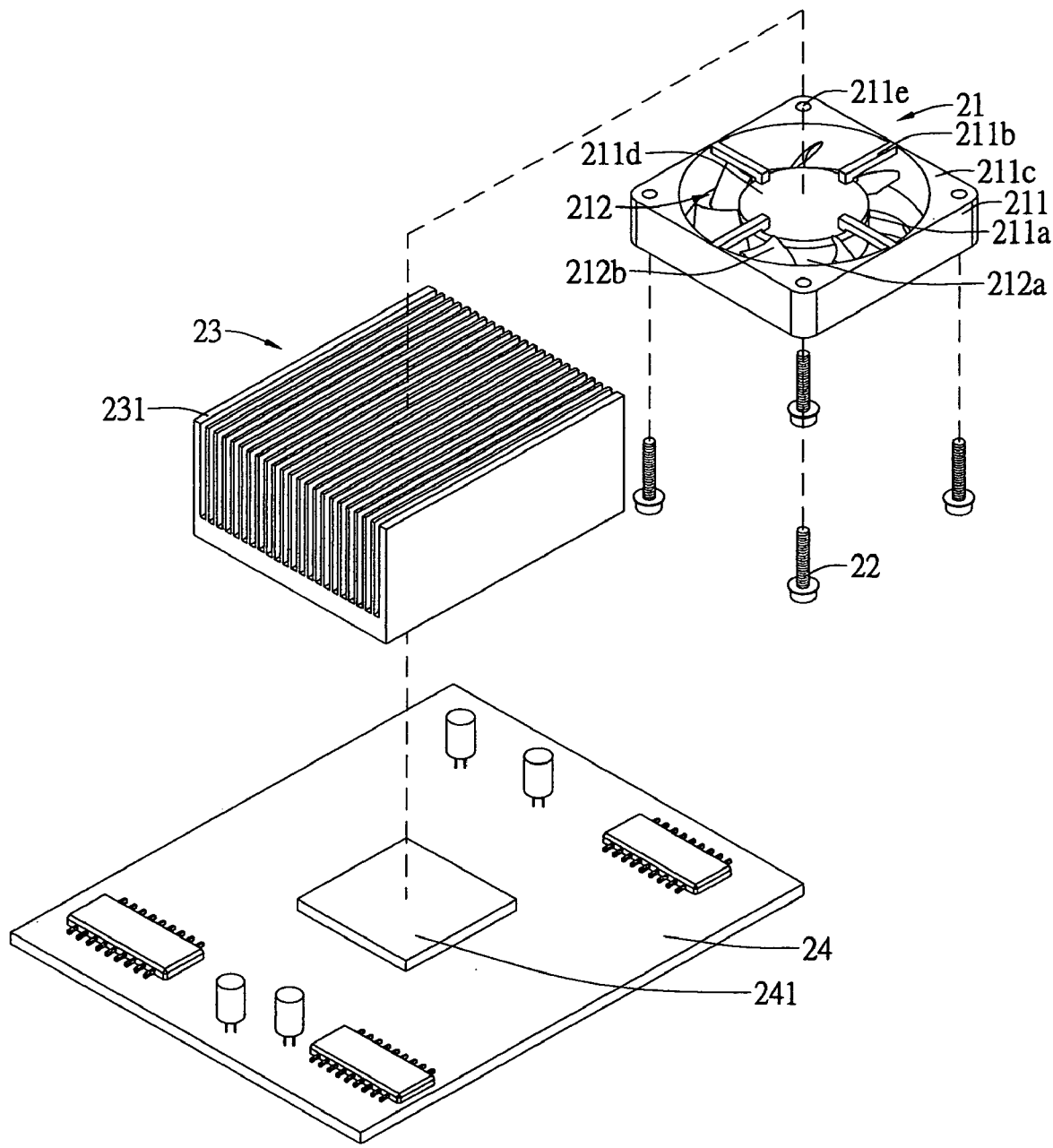
FIG. 4 is an exploded perspective view of the fan device according to the present invention.

Referring to FIG. 4, a fan device 21 according the present invention mainly includes a frame 211 and a fan blade part 212. The fan blade part 212 is composed of a fan hub 212a and fan blades 212b surrounding the fan hub 212a. The frame 211 provides a driving part 211a for being rotationally connected to the fan blade part 212. The driving part 211a is disposed at the center of the frame 211 and fixedly attached to the frame 211 with a plurality of locating parts 211b, which extend from a facial side 211c of the frame 211 and are joined to a joining surface 211d of the driving part 211a such that the joining surface 211d of the driving part 211a is at a level different from the facial side 211c, that is, a vertical distance is between the facial side 211c of the frame 211 and the joining surface 211d. The hub 212a, which is disposed beside the driving part 211a provides a height shorter than the fan blade part 212 so that a space resulting from the difference of height between the fan blade part 212 and the fan hub 212a can prevent from occurring stagnation zone.

Figure 5:
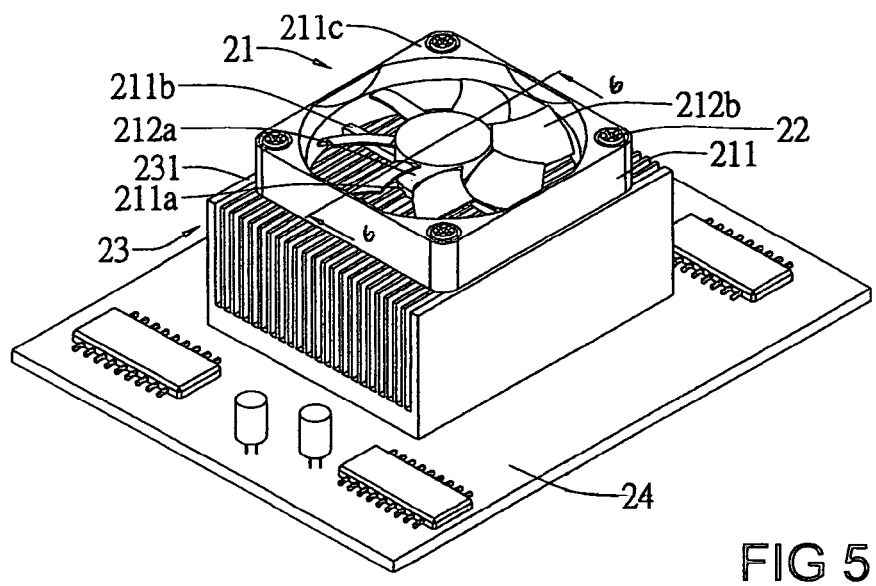
FIG. 5 is a perspective of the fan device according to the present invention.

Referring to FIGS. 4 and 5, when the fan device of the present invention is assembled, through holes 211e provided in the frame 211 are pierced with the screw thread components 22 so that the frame 211 can be engaged to the cooling fins 231 before the radiator being mounted on the chip 241 of the circuit board 23.

Figure 6:
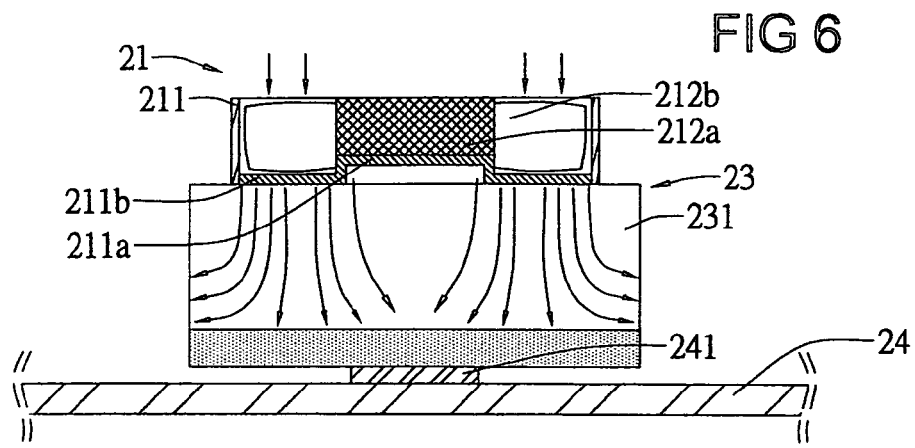
FIG. 6 is a sectional view along 6—6 shown in FIG. 5 illustrating flowing direction of air current.

Referring to FIG. 6, it can be seen that the air current flows under the joining surface 211d of the driving part 211a smoothly during the fan blade part 212 being driven to rotate with the driving part 211a. In this way, it can increase contact area of the radiator 23 with the air current and the heat dissipation effect can be enhanced significantly.

Figure 7:
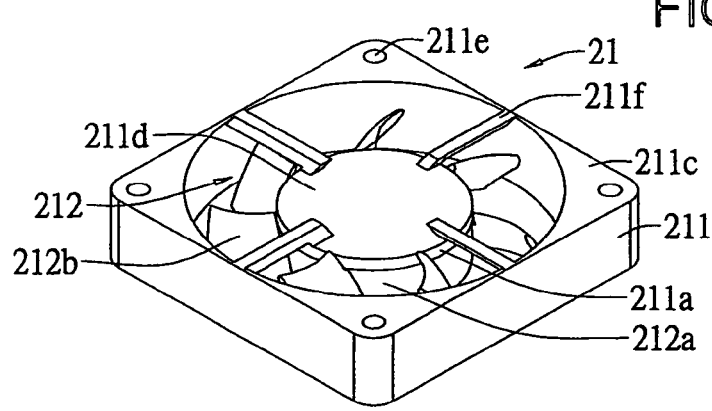
FIG. 7 is a perspective view of the fan device illustrating oblique shaped air guide plates.

Referring to FIG. 7, the locating part 211b shown in FIGS. 4, 5 and 6 can be replaced with oblique shaped air guide parts 211f to speed up the air current flowing under the joining surface 211d.

While the invention has been described with referencing to a preferred embodiment thereof, it is to be understood that modifications or variations may be easily made without departing from the spirit of this invention, which is defined by the appended claims.

What is claimed is:

1. A fan device, which is fastened to a radiator attached to a chip on a circuit board, comprising:

a frame, having a facial side and providing a driving part with a joining surface and the driving part being disposed above the radiator;

a fan blade part, being provided with a hub and a plurality of fan blades rotationally attached to the driving part for generating air current; and a plurality of locating parts, being joined to the facial side and the driving part;

characterized in that each of the locating parts is elongated with a bowed end being fixedly attached to the joining surface of the driving part radially such that an elevation difference is formed between the facial side of the frame and the joining surface of driving part to create a circular space between the joining surface and the radiator for the air current being able to pass through the circular space and enter the central region of the radiator.

* * * * *